United States Patent
Park (10) Patent No.: US 9,370,112 B2
(45) Date of Patent: Jun. 14, 2016

(54) IMPACT ABSORPTION MEMBER AND DISPLAY DEVICE INCLUDING THE SAME

(71) Applicant: Jae-Chun Park, Yongin (KR)

(72) Inventor: Jae-Chun Park, Yongin (KR)

(73) Assignee: SAMSUNG DISPLAY CO., LTD., Yongin, Gyunggi-do (KR)

( * ) Notice: Subject to any disclaimer, the term of this patent is extended or adjusted under 35 U.S.C. 154(b) by 242 days.

(21) Appl. No.: 13/855,122

(22) Filed: Apr. 2, 2013

(65) Prior Publication Data

US 2014/0029173 A1    Jan. 30, 2014

(30) Foreign Application Priority Data

Jul. 25, 2012   (KR) .................. 10-2012-0081300

(51) Int. Cl.
| | |
|---|---|
| *G06F 1/16* | (2006.01) |
| *H05K 5/00* | (2006.01) |
| *H04M 1/18* | (2006.01) |
| *H05K 5/02* | (2006.01) |
| *H05K 1/11* | (2006.01) |
| *H05K 1/03* | (2006.01) |

(52) U.S. Cl.
CPC ............ *H05K 5/0017* (2013.01); *H04M 1/185* (2013.01); *H05K 5/02* (2013.01); *G02F 2201/08* (2013.01); *G02F 2201/503* (2013.01); *G02F 2202/28* (2013.01); *H01L 2224/4824* (2013.01); *H05K 1/0393* (2013.01); *H05K 1/115* (2013.01); *H05K 2201/0133* (2013.01); *H05K 2201/0195* (2013.01); *H05K 2201/2009* (2013.01); *H05K 2203/1178* (2013.01); *H05K 2203/1438* (2013.01); *Y10T 428/24281* (2015.01)

(58) Field of Classification Search
CPC ............ H01L 2224/4824; H05K 2201/0195; H05K 2201/096; H05K 1/0393; H05K 2201/2009; H05K 2203/1178; H05K 1/115; H05K 2201/0133; H05K 2203/1438; B32B 3/266; B81B 2207/07; B81B 2207/092; G02F 2201/503; G02F 2201/08; G02F 2202/28
USPC ................. 174/255, 259; 361/679.3; 349/122; 455/575.1; 206/204, 591, 593; 362/362; 428/136, 137
See application file for complete search history.

(56) References Cited

U.S. PATENT DOCUMENTS

| | | | |
|---|---|---|---|
| 2006/0083894 A1* | 4/2006 | Vetrovec et al. | 428/137 |
| 2008/0303226 A1* | 12/2008 | Deib | 277/650 |
| 2009/0279313 A1* | 11/2009 | Teragawa | G02B 5/0247 362/355 |
| 2011/0292317 A1* | 12/2011 | Kim et al. | 349/61 |
| 2013/0135877 A1* | 5/2013 | Oh et al. | 362/362 |

FOREIGN PATENT DOCUMENTS

| | | | |
|---|---|---|---|
| KR | 1019990005378 | * | 9/2000 |
| KR | 10-2010-0010847 A | | 2/2010 |
| KR | 10-2012-0043603 A | | 5/2012 |

* cited by examiner

*Primary Examiner* — Hoa C Nguyen
*Assistant Examiner* — James Wu
(74) *Attorney, Agent, or Firm* — Lee & Morse, P.C.

(57) ABSTRACT

An impact absorption member includes an impact absorption sheet having an elastic material and including a plurality of bubble outlets penetratively extending in a thickness direction of the impact absorption sheet. Each of the bubble outlets includes a plurality of inclination areas inclined to have different inclination angles in the thickness direction.

12 Claims, 10 Drawing Sheets

IMPACT ABSORPTION MEMBER AND DISPLAY DEVICE INCLUDING THE SAME

CROSS-REFERENCE TO RELATED APPLICATION

This application claims priority under 35 U.S.C. §119 to and the benefit of Korean Patent Application No. 10-2012-0081300 filed in the Korean Intellectual Property Office on Jul. 25, 2012, the entire contents of which are incorporated herein by reference.

BACKGROUND

1. Field

Embodiments relate to an impact absorption member and a display device including the same.

2. Description of the Related Art

In general, a portable display device has a form in which a display panel for displaying an image is disposed within a case. In order to protect the display panel against an impact applied from the outside, an impact absorbing member may be interposed between the display panel and the case.

SUMMARY

Embodiments are directed to an impact absorption member including an impact absorption sheet having an elastic material and including a plurality of bubble outlets penetratively extending in a thickness direction of the impact absorption sheet, wherein the bubble outlets include a plurality of inclination areas inclined to have different inclination angles in the thickness direction.

The impact absorption member may further include an adhesive sheet stacked on at least one surface of the impact absorption sheet, wherein the bubble outlets extend to and penetrate the adhesive sheet.

A cross section of a bubble outlet of the plurality of bubble outlets may be a circular form or a slit form.

When the cross section of the bubble outlet is the circular form, at least one of the inclination areas of the bubble outlet satisfies a condition of $$D \leq T \cdot \tan \theta$$

where $\theta$ is an inclination angle of the inclination area, $D$ is a diameter of the inclination area, and $T$ is a thickness of the impact absorption sheet corresponding to the inclination area.

When the cross section of the bubble outlet is the slit form, at least one of the inclination areas of the bubble outlet satisfies a condition of $$W \leq T \cdot \tan \theta$$

where $\theta$ is an inclination angle of the inclination area, $W$ is a width of the inclination area in an inclination direction, and $T$ is a thickness of the impact absorption sheet corresponding to the inclination area.

With respect to each bubble outlet of the plurality of bubble outlets, a first opening formed on one surface of the impact absorption sheet by the bubble outlet and a second opening formed on the other surface of the impact absorption sheet by the bubble outlet may be eccentrically disposed with respect to the thickness direction.

Embodiments are also directed to a display device including a display panel that displays an image, a case that receives the display panel, and an impact absorption member interposed between the display panel and the case. The impact absorption member includes an impact absorption sheet having an elastic material and including a plurality of bubble outlets penetratively extending in a thickness direction. The bubble outlets each include a plurality of inclination areas inclined to have different inclination angles in the thickness direction.

When a cross section of a bubble outlet of the plurality of bubble outlets is circular, at least one of the inclination areas of the bubble outlet may satisfy a condition of $$D \leq T \cdot \tan \theta$$

where $\theta$ is an inclination angle of the inclination area, $D$ is a diameter of the inclination area, and $T$ is a thickness of the impact absorption sheet corresponding to the inclination area.

When a cross section of a bubble outlet of the plurality of bubble outlets is a slit form, at least one of the inclination areas of the bubble outlet may satisfy a condition of $$W \leq T \cdot \tan \theta$$

where $\theta$ is an inclination angle of the inclination area, $W$ is a width of the inclination area in an inclination direction, and $T$ is a thickness of the impact absorption sheet corresponding to the inclination area.

With respect to each bubble outlet of the plurality of bubble outlets, a first opening formed on one surface of the impact absorption sheet by the bubble outlet and a second opening formed on the other surface of the impact absorption sheet by the bubble outlet may be eccentrically disposed with respect to the thickness direction.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, an impact absorption member and a display device including the same according to embodiments will be described in detail with reference to the drawings. However, embodiments are not limited to the disclosed exemplary embodiments below, but may be implemented in various different forms. The exemplary embodiments are provided so that this disclosure will be thorough and complete, and will fully convey exemplary implementations to those skilled in the art. The same reference numerals are used to designate the same elements in the drawings.

In the drawings, the thickness of layers, films, panels, regions, etc., are exaggerated for clarity. Further, in the drawings, thicknesses of some layers and areas are exaggerated for better understanding and ease of description. where a part such as a layer, film, area, plate, etc. is described to be "on" another part, the part can be "directly on" the other part or other parts can be formed therebetween.

In addition, unless explicitly described to the contrary, the word "comprise" and variations such as "comprises" or "comprising," will be understood to imply the inclusion of stated elements but not the exclusion of any other elements. Furthermore, throughout the specification, when an element is referred to as being "on" another element, it can be above another element or below another element. It does not mean that the element must be above another element in a gravity direction as reference.

Figure 1:
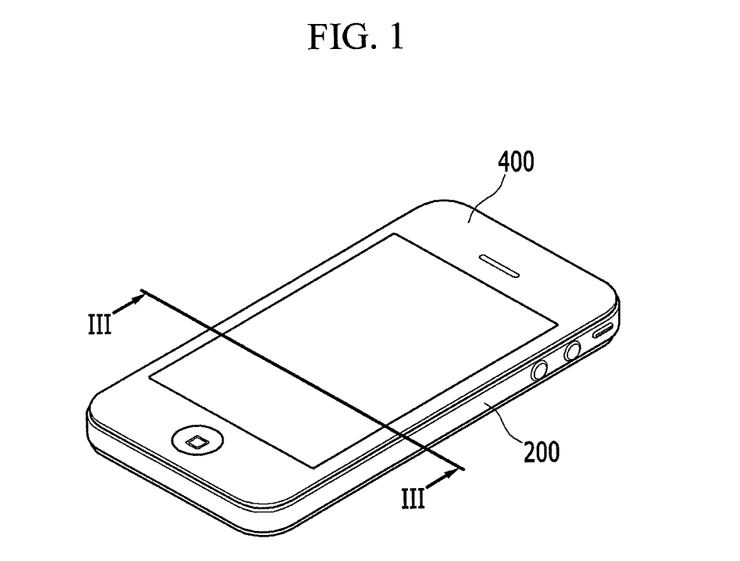
FIG. 1 is a perspective view of a display device according to an exemplary embodiment.
Figure 2:
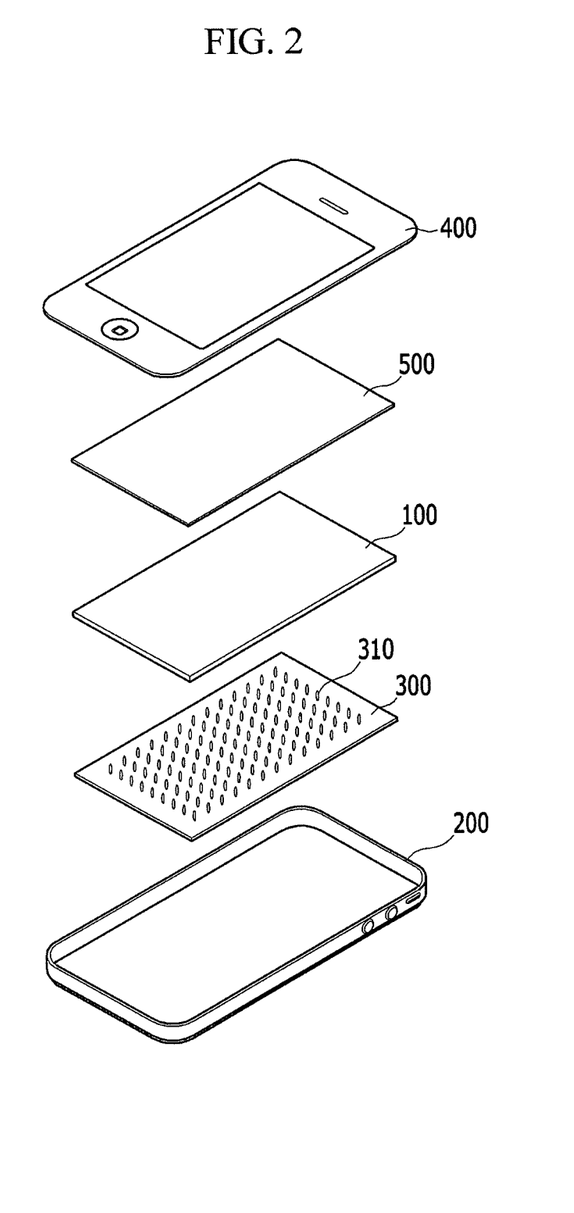
FIG. 2 is an exploded perspective view of a display device according to an exemplary embodiment.
Figure 3:
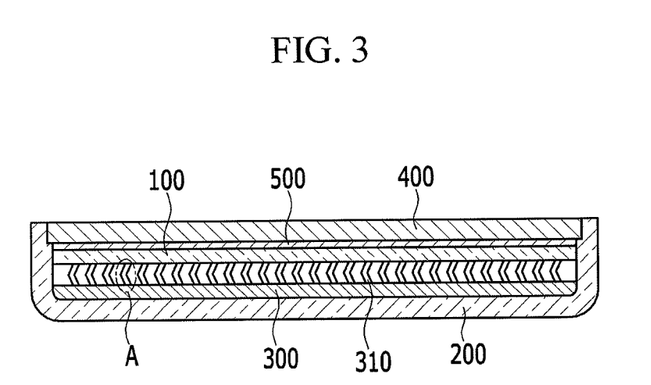
FIG. 3 is a cross-sectional view of the display device taken along the line III-III of FIG. 1.

FIG. 1 is a perspective view of a display device according to an exemplary embodiment, FIG. 2 is an exploded perspective view of a display device according to an exemplary embodiment, and FIG. 3 is a cross-sectional view of the display device taken along the line of FIG. 1.

Referring to FIGS. 1 to 3, a display device according to an exemplary embodiment includes a display panel 100, a case 200, and an impact absorption member 300.

The display panel 100 displays an image. As examples, self-light emitting display panels such as an organic light emitting display panel (OLED panel) and a plasma display panel (PDP) may be used for the display panel 100. Further, a non-light emitting display panel such as a liquid crystal display panel (LCD panel) may be used for the display panel 100. When the non-light emitting display panel is used for the display panel 100, the display device may include a backlight unit for supplying light to the display panel 100.

The case 200 receives the display panel 100. As shown in FIG. 2, a space for receiving the display panel 100 may be provided to protect the display panel 100 from an external impact. The space may be defined by a material having predetermined stiffness. The case 200 may be formed of a combination of two or more members. A case 200 formed of one member is described in the present exemplary embodiment as an example.

Further, the case 200 may further receive a printed circuit board (not shown) having a plurality of active devices (not shown) or passive devices (not shown) mounted thereto, as well as the display panel 100. Moreover, the case 200 may further receive a power supplier (not shown) such as a battery, according to the display device type.

Figure 4A:
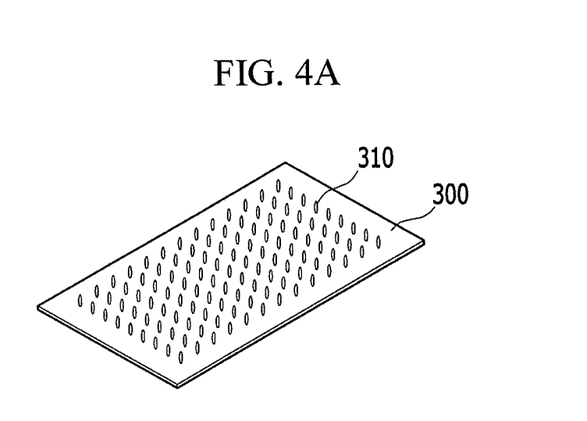
FIGS. 4A and 4B are perspective views of an impact absorption member according to an exemplary embodiment.
Figure 4B:
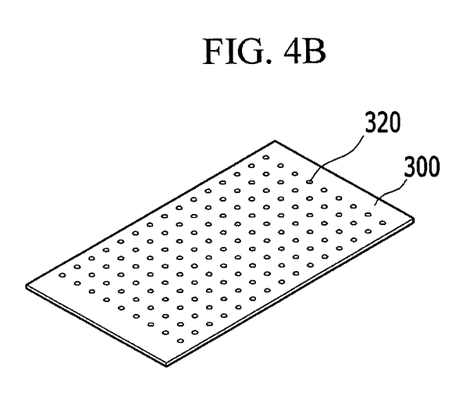

FIGS. 4A and 4B are perspective views of an impact absorption member according to an exemplary embodiment.

An impact absorption member 300 is interposed between the display panel 100 and the case 200 to absorb an external impact applied to the display panel 100, and thus to prevent the external impact from being directly transferred to the display panel 100. The impact absorption member 300 includes an impact absorption sheet 301 of an elastic material having a predetermined thickness so as to efficiently absorb the external impact (see FIGS. 5A-D and 6). Materials such as silicone and urethane, rubber foam, or a lamination of the rubber foam may used for the impact absorption sheet 301, as examples.

A plurality of bubble outlets 310 is formed in the impact absorption sheet 301 to penetrate the impact absorption sheet 301 in the thickness direction. The bubble outlets 310 serve to remove bubbles that may be generated when an adhesive is applied to one surface of the impact absorption sheet 301 or when the impact absorption sheet 301 is attached to the display panel 100 or the case 200 through an adhesive sheet. The plurality of bubble outlets 310 may be arranged on the impact absorption sheet 301 in a matrix form. A cross section of the bubble outlet 310 may be a slit as illustrated in FIG. 4A, or a circle form as identified by reference character 320 in FIG. 4B.

The impact absorption member 300 may further include an adhesive sheet 302 stacked on at least one surface of the impact absorption sheet 301, and the adhesive sheet 302 enables the impact absorption member 300 to be fixed to the display panel 100 or the case 200. When the adhesive sheet 302 is stacked on the one surface of the impact absorption sheet 301, the bubble outlets 310 extend to the adhesive sheet 302 and penetrate the adhesive sheet 302.

FIGS. 5A to 5D are cross-sectional views of exemplary variations of the bubble outlet formed in the impact absorption member according to an exemplary embodiment.

Figure 5A:
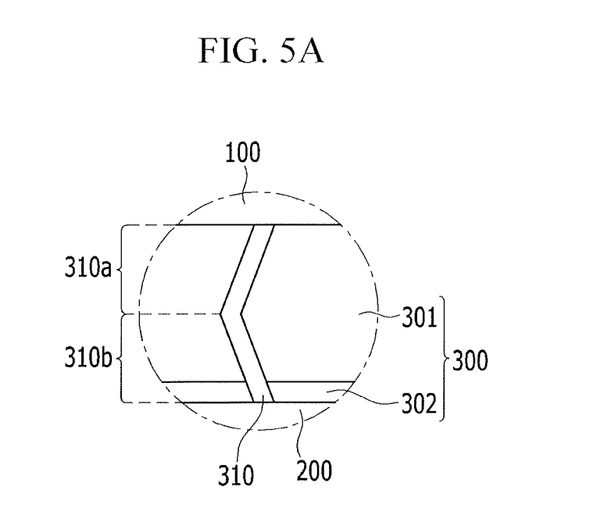
FIGS. 5A to 5D are cross-sectional views of exemplary variations of a bubble outlet formed in an impact absorption member according to an exemplary embodiment.
Figure 5B:
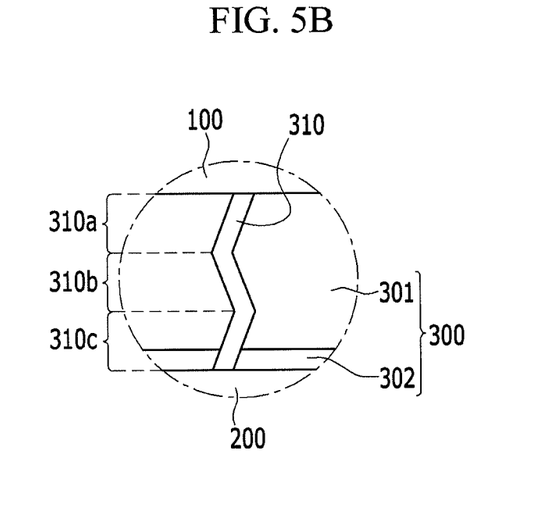
Figure 5C:
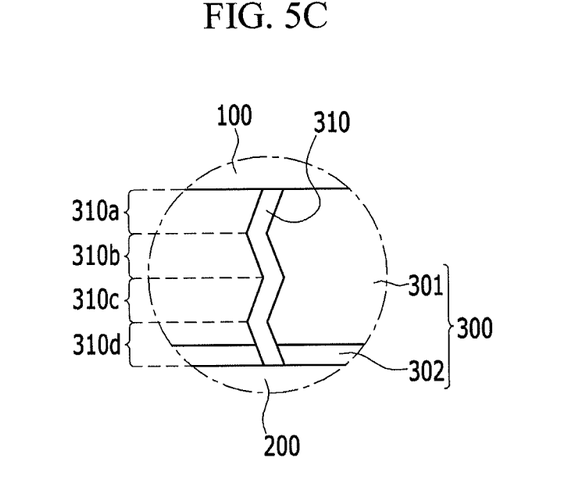

The bubble outlets 310 include a plurality of inclination areas inclined to have different inclination angles in the thickness direction. For example, the inclination areas may include two inclination areas 310a and 310b as illustrated in FIG. 5A, three inclination areas 310a, 310b, and 310c as illustrated in FIG. 5B, and four inclination areas 310a, 310b, 310c, and 310d as illustrated in FIG. 5C, as examples. In other implementations, the inclination areas may include five or more inclination areas. The respective inclination areas of the bubble outlet 310 have different inclination angles, so that the bubble outlet 310 penetrates the impact absorption sheet 301 with n−1 refractions when the bubble outlet 310 has n inclination areas.

If the bubble outlet 310 were to have only one inclination area having the inclination angle inclined in the thickness direction, a form of the bubble outlet 310 could be visually observed by the user through his/her eyes while light generated from the display panel to be parallel to an inclination direction goes through the bubble outlet 310. In contrast, when the bubble outlet 310 has two or more inclination areas having the inclination angle inclined in the thickness direction, according to embodiments, although the light parallel to the inclination direction penetrates an outermost inclination area, the light is blocked by and cannot penetrate a next inclination area, so that the form of the bubble outlet is not visually observable by the user through his/her eyes.

Figure 6:
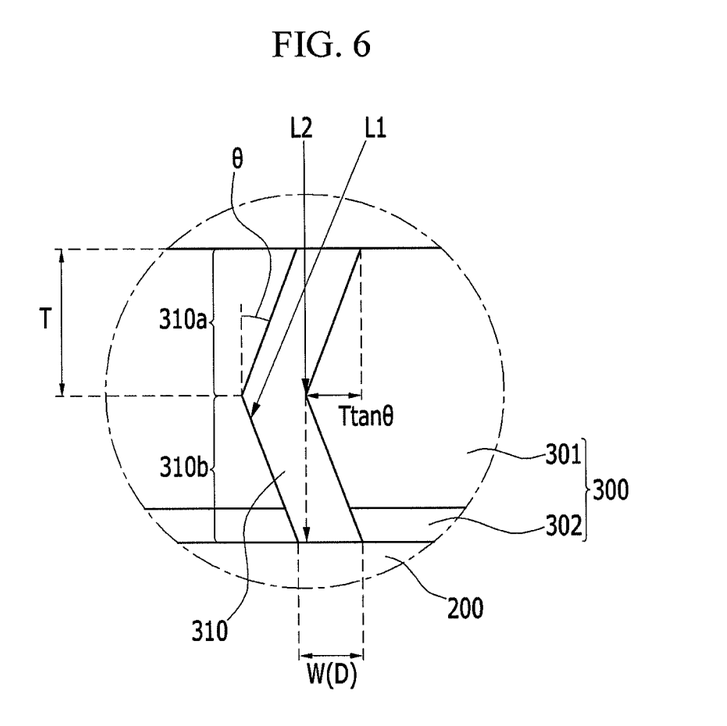
FIG. 6 is an enlarged view of a bubble outlet formed in an impact absorption member according to an exemplary embodiment.

FIG. 6 is an enlarged view of the bubble outlet formed in the impact absorption member according to an exemplary embodiment.

When the cross section of the bubble outlet 310 is the circle, at least one inclination area of the bubble outlet 310 may satisfy equation 1 below.

$$D \leq T \cdot \tan \theta \quad \text{[Equation 1]}$$

where θ is the inclination angle of the inclination area, D is a diameter of the inclination area, and T is a thickness of the impact absorption sheet corresponding to the inclination area.

Although light L1 and L2 generated from the display panel may penetrate an outermost inclination area 310a of the bubble outlet 310, the light L1 is blocked by and cannot penetrate a next inclination area 310b as described above. When light generated from display panel travels in the direction indicated by the light L2 in FIG. 6, a diameter D of the inclination area 310 may satisfy equation 1 to prevent and/or reduce the possibility of the light penetrating a plurality of inclination areas according to a relation of the inclination angle θ from being visually observed by the user. Although it is illustrated that the number of inclination areas of the bubble outlet 310 is two in the present exemplary embodiment, the same principles may apply when the bubble outlet 310 includes two or more inclination areas.

When the cross section of the bubble outlet 310 is the slit, at least one inclination area of the bubble outlet 310 may satisfy equation 2 below.

$$W \leq T \cdot \tan \theta \quad \text{[Equation 2]}$$

where θ is the inclination angle of the inclination area, W is a width of the inclination area in an inclination direction, and T is a thickness of the impact absorption sheet corresponding to the inclination area.

Configurations of the case where the cross section of the bubble outlet 310 is the slit are the same as configurations of the case where the cross section of the bubble outlet 310 is the circle, so that a detailed description will not be repeated.

Figure 5D:
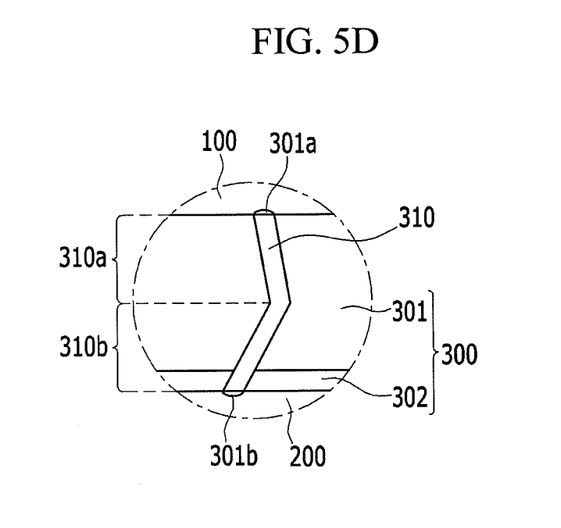

Referring to FIG. 5D, a first opening 301a formed on one surface of the impact absorption sheet 301 by the bubble outlet 310 and a second opening 301b formed on the other surface of the impact absorption sheet 301 by the bubble outlet 310 may be eccentrically formed with respect to the thickness direction of the impact absorption sheet 301. The first opening 301a and the second opening 301b may be formed on respective surfaces of the impact absorption sheet 301 so as not to overlap each other with respect to the thickness direction. Accordingly, the bubble outlets 310 may be prevented from being visually observable by the user while the user uses the display device. Even when the adhesive sheet 302 is stacked on at least one of two surfaces of the impact absorption sheet 301, the relation between the openings 301a and 301b may be the same as above.

A window member 400 may be disposed in a direction in which an image is screened in the display panel 100, and may be connected to the case 200 to configure an external surface of the display device together with the case 200. The window member 400 may include a display area in which an image generated by the display panel 100 is displayed and a non-display area adjacent to the display area on a flat surface.

The display device according to the present exemplary embodiment may further include an adhesive resin layer 500 interposed between the display panel 100 and the window member 400. The adhesive resin layer 500 attaches the window member 400 to the display panel 100. The adhesive resin layer 500 may be formed of a transparent adhesive material having high light transmissivity to prevent luminance of the image screened from the display panel 100 from being reduced.

By way of summation and review, an impact absorption member disposed between a display area and a case may be thin and may be attached to the display panel by an adhesive material. In a process of attaching the impact absorption member, a plurality of bubbles may be generated on the impact absorption member. In order to prevent the bubbles, protrusions and depressions may be formed on the impact absorption member or a slit and the like may be formed to penetrate in a thickness direction. When protrusions and depressions are formed on the impact absorption member, a contact area between the protrusions and depressions and the display panel may be reduced due to the form of the protrusions and depressions, and thus the adhesive power of the adhesive material may become insufficient and a lifting phenomenon may be generated. When a slit is formed to penetrate the impact absorption member, the slit may be visually observed by a user while light generated from the display panel goes through the slit.

Embodiments provide an impact absorption member that may prevent bubbles from being generated when attached. In contrast to the above, the embodiments provide a display device in which visibility may be improved. The embodiments may provide an impact absorption member in which light generated by the display panel is prevented from penetrating the impact absorption member.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An impact absorption member, comprising:
an impact absorption sheet having an elastic material and including a plurality of bubble outlets penetratively extending completely through the impact absorption sheet in a thickness direction from a first surface of the impact absorption sheet that contacts an adhesive to a second surface of the impact absorption sheet,
wherein the bubble outlets include a plurality of inclination areas inclined to have different inclination angles in the thickness direction such that light that penetrates the bubble outlets at one of the first surface and second surface is not visually observable through the bubble outlets at the other of the first surface or the second surface,
wherein a cross section of each bubble outlet of the plurality of bubble outlets, as viewed in a plan view, has a circular form or a slit form, and
wherein a width of the cross section of each bubble outlet, as viewed in the plan view, is smaller than or equal to $T \cdot \tan \theta$,
where T is a thickness of a portion of the impact absorption sheet corresponding to at least one of the inclination areas of the bubble outlet, and θ is an inclination angle of the inclination area with respect to a normal to the impact absorption sheet, and wherein each of the plurality of bubble outlets is discontinuous with adjacent bubble outlets within the impact absorption sheet.

2. The impact absorption member of claim 1, wherein the adhesive includes an adhesive sheet stacked on at least one surface of the impact absorption sheet, wherein the bubble outlets extend to and penetrate the adhesive sheet.

3. The impact absorption member of claim 1, wherein:
when the cross section of the bubble outlet is the circular form, at least one of the inclination areas of the bubble outlet satisfies a condition of $D \leq T \cdot \tan \theta$ where D is a diameter of the circular cross section of each bubble outlet.

4. The impact absorption member of claim 1, wherein:
when the cross section of the bubble outlet is the slit form, at least one of the inclination areas of the bubble outlet satisfies a condition of $W \leq T \cdot \tan \theta$ where W is a width of the slit-shaped cross section of each bubble outlet in an inclination direction.

5. The impact absorption member of claim 1, wherein:
with respect to each bubble outlet of the plurality of bubble outlets, a first opening formed on the first surface of the impact absorption sheet by the bubble outlet and a second opening formed on the second surface of the impact absorption sheet by the bubble outlet are eccentrically disposed with respect to the thickness direction.

6. A display device, comprising:
a display panel that displays an image;
a case that receives the display panel; and
an impact absorption member interposed between the display panel and the case,
wherein the impact absorption member includes:
an impact absorption sheet having an elastic material and including a plurality of bubble outlets penetratively extending completely through the impact absorption sheet in a thickness direction from a first surface of the impact absorption sheet that contacts an adhesive to a second surface, and the bubble outlets each include a plurality of inclination areas inclined to have different inclination angles in the thickness direction such that light that penetrates the bubble outlets at one of the first surface and second surface is not visually observable through the bubble outlets at the other of the first surface or the second surface, wherein a cross section of each bubble outlet of the plurality of bubble outlets, as viewed in a plan view, has a circular form or a slit form, and wherein a width of the cross section of each bubble outlet, as viewed in the plan view, is smaller than or equal to $T \cdot \tan \theta$, where T is a thickness of a portion of the impact absorption sheet corresponding to at least one of the inclination areas of the bubble outlet, and $\theta$ is an inclination angle of the inclination area with respect to a normal to the impact absorption sheet, and wherein each of the plurality of bubble outlets is discontinuous with adjacent bubble outlets within the impact absorption sheet.

7. The display device of claim 6, wherein:
when a cross section of a bubble outlet of the plurality of bubble outlets is circular,
at least one of the inclination areas of the bubble outlet satisfies a condition of $$D \leq T \cdot \tan \theta$$

where D is a diameter of the inclination area.

8. The display device of claim 6, wherein:
when a cross section of a bubble outlet of the plurality of bubble outlets is a slit form,
at least one of the inclination areas of the bubble outlet satisfies a condition of $$W \leq T \cdot \tan \theta$$

where W is a width of the inclination area in an inclination direction.

9. The display device of claim 6, wherein:
with respect to each bubble outlet of the plurality of bubble outlets, a first opening formed on the first surface of the impact absorption sheet by the bubble outlet and a second opening formed on the second surface of the impact absorption sheet by the bubble outlet are eccentrically disposed with respect to the thickness direction.

10. The impact absorption member of claim 1, wherein the cross sections of plurality of bubble outlets, as viewed in the plan view, are arranged in a matrix form in the impact absorption sheet.

11. The impact absorption member of claim 1, wherein each of the plurality of bubble outlets consists essentially of a plurality of linear inclination areas.

12. The impact absorption member of claim 1, wherein:
a number of openings of the plurality of bubble outlets through the first surface equals a number of openings of the plurality of bubble outlets through the second surface, each opening in the first surface being connected to a single corresponding opening in the second surface to define a single bubble outlet with a plurality inclination areas, and each opening in the first surface being eccentric with respect to the corresponding opening in the second surface connected thereto.

* * * * *